United States Patent
Hori et al.

(10) Patent No.: US 7,737,622 B2
(45) Date of Patent: Jun. 15, 2010

(54) LIGHT EMITTING ELEMENT WITH SEMICONDUCTIVE PHOSPHOR

(75) Inventors: Kenya Hori, Okayama (JP); Masayuki Ono, Osaka (JP); Kumio Nago, Nara (JP); Toshiyuki Aoyama, Osaka (JP); Kenji Hasegawa, Osaka (JP); Masaru Odagiri, Hyogo (JP)

(73) Assignee: Panasonic Corporation, Osaka (JP)

(*) Notice: Subject to any disclaimer, the term of this patent is extended or adjusted under 35 U.S.C. 154(b) by 409 days.

(21) Appl. No.: 10/562,792

(22) PCT Filed: Jul. 1, 2004

(86) PCT No.: PCT/JP2004/009685

§ 371 (c)(1),
(2), (4) Date: Dec. 29, 2005

(87) PCT Pub. No.: WO2005/004548

PCT Pub. Date: Jan. 13, 2005

(65) Prior Publication Data

US 2006/0176244 A1    Aug. 10, 2006

(30) Foreign Application Priority Data

Jul. 2, 2003  (JP) .................. 2003-190406

(51) Int. Cl.
*H01J 63/04* (2006.01)
(52) U.S. Cl. .................................................. 313/503
(58) Field of Classification Search ................ 313/503, 313/504; 428/216, 690
See application file for complete search history.

(56) References Cited

U.S. PATENT DOCUMENTS

| | | | | | |
|---|---|---|---|---|---|
| 4,937,150 | A | * | 6/1990 | Tsukada | 428/690 |
| 5,587,329 | A | * | 12/1996 | Hseuh et al. | 438/30 |
| 5,990,373 | A | * | 11/1999 | Klabunde | 588/313 |
| 6,265,823 | B1 | * | 7/2001 | Dobson et al. | 313/501 |

(Continued)

FOREIGN PATENT DOCUMENTS

JP    56125748 A   * 10/1981

(Continued)

OTHER PUBLICATIONS

International Preliminary Report on Patentability and Written Opinion of the International Searching Authority, issued in corresponding International Patent Application No. PCT/JP2004/009685, dated on May 26, 2006.

(Continued)

*Primary Examiner*—Joseph L Williams
*Assistant Examiner*—Hana A Sanei
(74) *Attorney, Agent, or Firm*—McDermott Will & Emery LLP

(57) ABSTRACT

A phosphor element (10) of the present invention includes a pair of electrodes (2, 6) facing each other, and a phosphor layer (4) interposed between the pair of electrodes and including a semi-conductive phosphor fine particle (7) in which at least a part of the surface is covered with a conductive organic material (8). The conductive organic material is preferably chemically adsorbed on the surface of the semi-conductive phosphor fine article. Further, it is preferable that electron transport layers (3, 5) be further provided between the phosphor layer and at least one of the electrodes.

7 Claims, 2 Drawing Sheets

U.S. PATENT DOCUMENTS

| | | |
|---|---|---|
| 2001/0024183 A1* | 9/2001 | Ode et al. .................... 345/87 |
| 2003/0003300 A1 | 1/2003 | Korgel et al. |
| 2003/0042850 A1 | 3/2003 | Bertram et al. |
| 2004/0246408 A1 | 12/2004 | Ando et al. |

FOREIGN PATENT DOCUMENTS

| | | |
|---|---|---|
| JP | 63-66282 | 3/1988 |
| JP | 63-318092 | 12/1988 |
| JP | 8-306485 | 11/1996 |
| JP | 11-135258 | 5/1999 |
| JP | 2001-076879 | 3/2001 |
| JP | 2001-279240 | 10/2001 |
| JP | 2002-299063 | 10/2002 |
| JP | 2003-115385 | 4/2003 |
| WO | WO 03/021694 A2 | 3/2003 |

OTHER PUBLICATIONS

Chinese Office Action, with English Translation, issued in Chinese Patent Application No. CN 200480018347.3, dated Mar. 7, 2008.
Japanese Office Action issued in Japanese Patent Application No. 2005-511405, mailed Aug. 11, 2009.

* cited by examiner even when an electric field is applied, and repulsion due to
LIGHT EMITTING ELEMENT WITH SEMICONDUCTIVE PHOSPHOR This application is the U.S. National Phase under 35 U.S.C. §371 of International Application No. PCT/JP2004/009685, filed Jul. 1, 2004, which in turn claims the benefit of Japanese Application No. 2003-190406, filed Jul. 2, 2003, the disclosures of which Applications are incorporated by reference herein in their entirety.

TECHNICAL FIELD

The present invention relates to a phosphor element using a luminescent inorganic material, and a display device using the phosphor element.

BACKGROUND ART

As a display device attracting attention as a flat panel display together with a liquid crystal panel, a plasma display and the like, there is a display device using electroluminescent (hereinafter referred to as EL) elements. EL elements include an inorganic EL element in which an inorganic compound is used as an illuminant, and an organic EL element in which an organic compound is used as an illuminant. An EL element has such characteristics as high-speed responsiveness, high contrast, vibration proof and the like. The EL element may be used in high pressure or low pressure since there is no gas part inside thereof. In an organic EL element, a certain gradient can be expressed with an active matrix type drive using thin film transistors (TFT) since the driving voltage is low. However, the element is subject to humidity or the like, and the lifetime is short. On the other hand, an inorganic EL element has such characteristics as longer lifetime, a use temperature range being wide, excellent in durability and the like, comparing with the organic EL element. However, since a voltage required for emitting light is as high as 200 to 300V in an inorganic EL element, an active matrix type driving using thin film transistors (TFT) was difficult. Therefore, an inorganic EL element has been driven by passive matrix. In the passive matrix driving, there are provided a plurality of scan electrodes extending in parallel with a first direction, and a plurality of data electrodes extending in parallel with a second direction orthogonal to the first direction, and a phosphor element is interposed between the scan electrode and data electrode crossing each other. By applying an AC voltage between a pair of scan electrode and data electrode, one phosphor element is driven. In the passive matrix driving, when the number of scan lines increases, the average luminance of the whole display device is lowered. Generally, an inorganic illuminant is so configured that a luminescent material is doped in an dielectric crystal. Therefore, although luminescence is generated when UV light is irradiated, an electron is less likely to penetrate into the dielectric crystal even when an electric field is applied, and repulsion due to electrification is also strong. Therefore, a high energy electron is required to generate luminescence. In order to generate luminescence with low energy electrons, countermeasures must be taken.

According to the art described in Japanese Patent Publication No. 54-8080, a phosphor layer is so configured that ZnS forms the main body and Mn, Cr, Tb, Eu, Tm, Yb and the like are doped so as to drive inorganic EL elements (cause to emit light), whereby the luminescent brightness was improved. However, since they were only driven with a high voltage of 200 to 300V, TFTs could not be used.

DISCLOSURE OF THE INVENTION

In a case where a phosphor element is used as a high-definition display device such as a television, it is required that a phosphor element is driven with a low voltage in which TFTs can be used.

An object of the present invention is to provide a phosphor element capable of being driven with a low voltage and having a long lifetime, in which thin film transistors can be used.

A phosphor element according to the present invention is characterized as to include a pair of electrodes facing each other, and a phosphor layer interposed between the pair of electrodes and including a semi-conductive phosphor fine particle in which at least a part of the surface is covered with a conductive organic material.

The phosphor element is an EL element in which a luminescent inorganic material is used. The phosphor layer of the EL element includes semi-conductive phosphor particles. The surface of the semi-conductive phosphor particle is covered with a conductive organic material. It is preferable that the conductive organic material be chemically adsorbed on the surface of the semi-conductive phosphor fine particle.

The present inventor found this time that when a conductive organic material was covered the surface of a semi-conductive phosphor particle, or was chemically adsorbed preferably, it was possible to perform a low voltage drive due to an effect of injection barrier reduction and electrification reduction, and also to obtain an EL element of long lifetime. Further, the inventor also found that repulsion of electrification was reduced when an electron transport layer was provided to the EL element between the phosphor layer and at least one of the pair of electrodes, and also the element was driven with an even lower voltage.

Each component of the phosphor element according to the present invention will be explained.

The phosphor element may be fixed on a substrate. As the substrate, a material with high electrical dielectric properties is used. When light of the phosphor element is extracted from the substrate side, a substrate made of a material with high light transparency in a visible region is used. When the temperature of the substrate reaches several hundreds degrees Celsius in the manufacturing step of the phosphor element, a material, which has a high softening point and is excellent in heat resisting properties and in which the heat expansion coefficient is the same level as that of a film to be laminated, is used. As such a substrate, glass, ceramics or silicon wafer may be used. However, non-alkali glass may be used such that alkali ion and the like included in typical glass will not have influence on the phosphor element. Further, alumina or the like may be coated on the glass surface as an ion barrier layer of alkali ion to the phosphor element.

For an electrode, a material which has high electric conductivity but no ion migration due to an electric field is used. As the electrode, aluminum, molybdenum, tungsten or the like may be used. For the electrode on the side of extracting the light of the phosphor element, a material of high transparency in a visible region may be used, in addition to the electrode characteristics described above. As the electrode, an electrode mainly made of tin dope indium oxide (ITO) or the like may be used. Note that the phosphor element and/or display device of the present invention may be driven with DC or AC or pulse.

An electron transport material is a material of high electron mobility for transporting electrons rapidly within an electron transport layer. As an electron transport material, a material for reducing repulsion due to electrification may be used. The material is preferably stable chemically in order to increase the lifetime of the phosphor element. As such a material, material mainly made of a typical conductive organic compound such as alumiquinolinate or oxadiazole derivative, and a typical conductive high-polimar material mainly made of polymethyl methacrylate and the like, if organic, may be used.

In the present invention, a semi-conductive phosphor fine particle is used as an illuminant. As a semi-conductive phosphor fine particle, a fine particle of sulfide, selenide, telluride, nitride, phosphide, arsenide, antimonide, carbide, oxide, chloride, bromide and iodide of cadmium, zinc, mercury, lead, tin, indium, antimony, arsenic, silicon, gallium, aluminum, bismuth, beryllium, magnesium, calcium and strontium, and sulfur, selenium, tellurium, silicon and germanium my be used. Further, a fine particle of a compound and a solid solution of these materials may be used. Further, such a fine particle that includes a different element of 5 weight percentage or less is included in the fine particle described above as an activator agent may be used. For example, at lest one element selected from metallic elements including manganese, copper, silver, gold, tin, lead, praseodymium, neodymium, samarium, europium, gadolinium, terbium, dysprosium, holmium, erbium, thulium, ytterbium, cesium, titanium, chrome, and aluminum is activated. Further, as the activator agent, a nonmetallic element such as chlorine or iodine, or fluoride such as $TbF_3$ or $PrF_3$ may be used, or two kinds or more thereof may be activated together. Further, examples of particularly preferable host crystal with low resistance include oxide or composite oxide containing at least one element selected from the group consisting of Zn, Ga, In, Sn and Ti. Examples of the respective phosphors include ZnO:Zn (luminescent color is blue green), (Zn, Mg)O:Zn (blue), $ZnGa_2O_4$:Mn (green), $In_2O_3$:Eu (red), $SnO_2$:Eu (red), $CaTiO_3$:Pr (red). Further, a fine particle in which a host crystal of relatively high resistance such as zinc sulfide and a host crystal of relatively low resistance such as ZnO or $In_2O_3$ are mixed may be used.

The particle diameter of a semi-conductive phosphor fine particle is 1 μm or less, and it is preferable that the particle diameter be as small as possible since the luminescence center within the fine particle is excited more easily. In order to cause the luminescence center to be excited more easily, the particle diameter of the fine particle may be nano-sized so as to utilize the quantum effect. In the case of a particle diameter of about 100 nm, it is difficult to obtain a sufficient quantum effect. Therefore, in order to reduce the injection barrier on the surface of the center of the fine particle and stabilize the fine particle, it is preferable to use an illuminant which is covered with a conductive organic material with π electron or performed with chemical adsorption, preferably. It is preferable that the compound and the solid solution have high light transparency in a visible light region. Note that a color filter may be added to the configuration of the element in order to obtain a specific color.

Here, a luminescent mechanism of the fine particle will be considered. First, a conventional inorganic illuminant will be explained. A conventional inorganic illuminant has such a configuration that a luminescence center exists in a crystal having insulating properties (hereinafter referred to as a host crystal). It is considered that luminescence is generated due to an excitation of the luminescence center. The host crystal is excited by an energy applied from the outside, but most of the conduction electrons and holes generated in the conduction band and in the valence band of the host crystal are captured in the impurity center or the lattice defect. A luminescence center is considered as one which is doped as an impurity center or a lattice defect. Therefore, it is necessary to select a material having a high efficiency in conducting an energy applied from the outside to the luminescence center, as the host crystal. It is considered that the luminous efficiency becomes low or luminescence is not caused if the element only consists of the luminescence center. Further, if there are two kinds or more luminescence centers or the concentration of the luminescence center is high, there may be a case where the excitation energy is transmitted between the luminescence centers. When the luminescence and absorptions are the same in the two luminescence centers, it is considered that the excitation energy is transmitted from one direction to another due to the resonance of quantum mechanics. The dope amount at the luminescence center has the optimum value, and the luminescent intensity decreases when it exceeds a certain concentration. The main reason is so considered that the excitation energy of the luminescence center is delivered to the non-luminous part of the luminescence center due to the resonance energy transmission described above. Therefore, an inorganic phosphor, in which the luminescence center exists in the conventional host crystal with insulating properties, emits light by an applied energy such as an ultraviolet light, but it is considered that a high voltage of about 200V must be applied in order to emit light by applying an electric field.

In order to easily transmit the excitation energy (specifically, electronic energy) to the luminescence center by the host crystal due to the electric field, a material having more conductivity than a conventional one was used for the host crystal. For example, zinc oxide is a well-known conductor as a transparent electrode, the relationship between the ratio of the lattice defect existing (zinc excess part or oxygen excess part) and the conductivity of the zinc oxide are in the inverse proportion. When zinc oxide is used as the host crystal, the conductivity of the zinc oxide is lowered by generating lattice defect due to dope or the like, so the zinc oxide is considered as a semi-conductive material, that is, a semiconductor. By the same reason, a semiconductor using p-n junction used for a transistor or the like may be used as an illuminant of the present invention. When a semi-conductive phosphor fine particle having a plurality of semiconductor areas utilizing p-n junction used for a transistor or the like is used as an illuminant, n-type semiconductor area may be segregated on the surface side of the semi-conductive phosphor fine particle, and p-type semiconductor area may be segregated on the center side. Alternatively, both semiconductor areas may be dispersed in a fine particle.

Further, as shown in the cross-sectional view of the semi-conductive phosphor fine particle of FIG. 2, the surface of the semi-conductive phosphor fine particle 7 is covered with a conductive organic material 8 in order to cause the electronic energy to be transmitted more easily. Further, it is preferable that the conductive organic material 8 and the surface are chemically coupled. The conductive organic material 8 used here covers the surface of the illuminant or is chemically coupled preferably, in order to reduce the energy barrier of the electrode and the illuminant of the phosphor element. As a result of the energy barrier of the electrode and the illuminant of the phosphor element is reduced, it is considered that the electronic energy is easily transmitted to the illuminant, and the phosphor element of the present invention is driven with a low voltage. Since the illuminant is a particle, it is possible to reduce the energy barrier throughout the surface of the illuminant. Generally, as the particle diameter becomes smaller, the material becomes unstable chemically. As for the illuminant, when the particle diameter is nano-sized, the illuminant becomes unstable chemically. In such a case, the conductive organic material 8 also serves to protect the illuminant.

As the conductive organic material 8, a typical conductive organic material having π electron cloud in the structure thereof may be selected. Further, it is preferable to use an organic material having a high glass transition point where the characteristics do not change by the temperature or the like. As such a material, a high-molecular material may be used. Further, as a conductive organic material for causing chemical adsorption on the surface of the semi-conductive phosphor fine particle, an organic material having a functional group such as a hydroxyl group, a carbonyl group or a carboxyl group. As a method for chemical adsorption, there is a method in which a carboxyl group (—COOH) is introduced in a conductive organic material, and ester linkage is performed with a hydroxyl group (—OH) on the surface of the semi-conductive phosphor fine particle and is fixed, for example. Further, instead of the carboxyl group, a thiocarboxyl group, a dithiocarboxyl group, a sulfo group, a sulfino group, a sulfeno group, a phosphono group, a phosphine group, a mercapto group, a trimethoxysilyl group, a trichlorosilyl group, an amido group, or an amino group may be used. Further, a coordinate bond of a metallic element of a semi-conductive phosphor fine particle and an element having a lone pair of electrons such as nitrogen, oxygen, sulfur and phosphorus which are conductive organic material may be used. Preferable examples of conductive organic materials include: polyacetylene series; polyphenylene series such as polyparaphenylene, polyphenylene vinylene, polyphenylene sulfide, and polyphenylene oxide, heterocyclic polymer series such as polypyrrole, polythiophene, polyfuran, polyselenophene and polytellurophene; ionicity polimer series such as polyaniline, polyacene series, polyester series, metal phthalocyanine series, and their conductors, copolymers, and compounds. Further, more preferably, poly-N-vinylcarbazole (PVK), polyethylene dioxythiophene (PEDOT), polystyrene sulfonic acid (PSS), and polymethyl phenylsilane (PMPS) and the like may be used. Further, as a more preferable example, an organic material with electron transport property may be used. Organic materials with electron transport property mainly include low-molecular materials and high-molecular materials. The low-molecular materials with electron transport property include oxadiazole derivative, triazole derivative, styrylbenzene derivative, silol derivative, 1,10-phenanthroline derivative, quinolinol metallic complex, thiophene derivative, fluorene derivative, quinone derivative, and their dimer and trimer. More preferably, the following materials are included: 2-(4-biphenyl)-5-(4-tert-butylphenyl)-1,3,4-oxadiazole (PBD), 2,5-bis(1-naphthyl)-1,3,4-oxadiazole (BND), 2,5-bis[1-(3-methoxy)-phenyl]-1,3,4-oxadiazole (BMD), 1,3,5-tris[5-(4-tert-butylphenyl)-1,3,4-oxadiazole-2-il]benzene (TPOB), 3-(4-biphenyl)-4-phenyl-5-(4-tert-butylphenyl)-1,2,4-triazole (TAZ), 3-(4-biphenyl)-4-(4-ethylphenyl)-5-(4-tert-butylphenyl)-1,2,4-triazole (p-EtTAZ), 4,7-diphenyl-1,10-phenanthroline (BPhen), 2,9-dimethyl-4,7-diphenyl-1,10-phenanthroline (BCP), 3,5-dimethyl-3',5'-di-tert-butyl-4,4'-diphenoquinone (MBDQ), 2,5-bis[2-(5-tert-butylbenzoxazolyl)]-thiophene (BBOT), trinitrofluorenone (TNF), tris(8-quinolinolato) aluminum (Alq3), and 5,5'-bis(dimesitylboryl)-2,2'bithiophene (BMB-2T), but not limited to these materials. Further, the high-molecular materials with electron transport property include poly-[2-methoxy-5-(2-ethyl hexyl oxy)-1,4-(1-cyano vinylene)phenylene] (CN-PPV), poly-quinoxaline, and a polymer in which a molecular structure showing the electron transport property in the low-molecular series is incorporated in the molecular chain. Note that illuminants, in each of which the semi-conductive phosphor fine particle is covered with a conductive material or preferably the conductive material is chemically adsorbed, may be dispersed in the material of the transparent conductive matrix. As such a transparent conductive material, the conductive organic material or the organic material with electron transport property described above may be used. Further, a form, in which conductive materials of low-molecular series such as the organic material with electron transport property described above or inorganic conductive or inorganic semi-conductive materials are dispersed in a conductive or nonconductive polymer and the conductivity is applied, may be acceptable.

The configuration of the phosphor element according to the present invention will be explained.

As shown in FIG. 1, the phosphor element includes a phosphor layer containing a semi-conductive phosphor fine particle in which at least a part of the surface thereof is covered with a conductive material or the conductive material is chemically adsorbed thereon, in between a pair of electrodes facing each other. Further, the phosphor element may include at least one electron transport layer, or the phosphor layer may be interposed between two electron transport layers. Note that the electrodes may be formed on a substrate. The semi-conductive phosphor fine particles described above may be dispersed in the matrix of a transparent conductor. Further, an electron injection layer may be provided between the electron transport layer and an electrode. Further, since the phosphor element 20 shown in FIG. 3 can be driven with a low voltage, a display device 30 in which active matrix driving is possible with a low voltage can be obtained by providing a thin film transistor (TFT) 11 in the structure thereof.

Next, in the phosphor element, conditions for obtaining a sufficient luminous efficiency will be considered. The phosphor element is driven by applying an outside electric field to the electrodes of the phosphor element, and the electron is transmitted to the illuminant from the applied outside electric field through the electrodes and the electron transport layer. The energy barrier of the electron transport layer and the semi-conductive phosphor fine particle is reduced by the material in which the surface of the semi-conductive phosphor fine particle is covered with the conductive material or preferably the conductive material is chemically adsorbed, so the electron is transmitted to the semi-conductive phosphor fine particle effectively.

The luminescence center in the semi-conductive phosphor fine particle is excited by the energy of the electron transmitted, and emits light when it is in the ground state. That is, as the size of the semi-conductive phosphor fine particle becomes smaller, a sufficient luminous efficiency can be obtained, but as the particle diameter becomes smaller, the fine particle itself becomes unstable. In order to keep the small particle diameter stable, the surface of a fine particle is required to be covered or performed a chemical adsorption. With the conductive material covering or being chemically adsorbed, it is possible to transmit the energy effectively to the luminescence center within the semi-conductive phosphor fine particle.

Further, by forming an electron transport layer on the phosphor layer, it is possible to transmit the electron to the semi-conductive phosphor fine particle effectively. Further, when the phosphor layer is interposed between the electron transport layers, the electron transport layers also serve as hole stopper layers, whereby the electron transmitted is not recombined with the hole, so it is transmitted to the semi-conductive phosphor fine particle.

As such an electron transport layer, the low-molecular materials with electron transport property described above or high-molecular material with electron transport property may be used. Further, a form in which low-molecular materials with electron transport property or n-type inorganic semi-conductive materials are dispersed in a conductive or nonconductive polymer is also possible.

According to the phosphor element of the present invention, an illuminant is composed of a semi-conductive phosphor fine particle, and at least a part of the surface of the semi-conductive phosphor fine particle is covered with a conductive material, or preferably a chemical adsorption is performed. Thereby, it was possible to obtain a phosphor element driven with a low voltage, due to high efficient luminescence caused by chemically stable fine particles.

BRIEF DESCRIPTION OF THE DRAWINGS

The present invention will become readily understood from the following description of preferred embodiments thereof made with reference to the accompanying drawings, in which like parts are designated by like reference numeral and in which.

DESCRIPTION OF THE PREFERRED EMBODIMENTS

Figure 1:
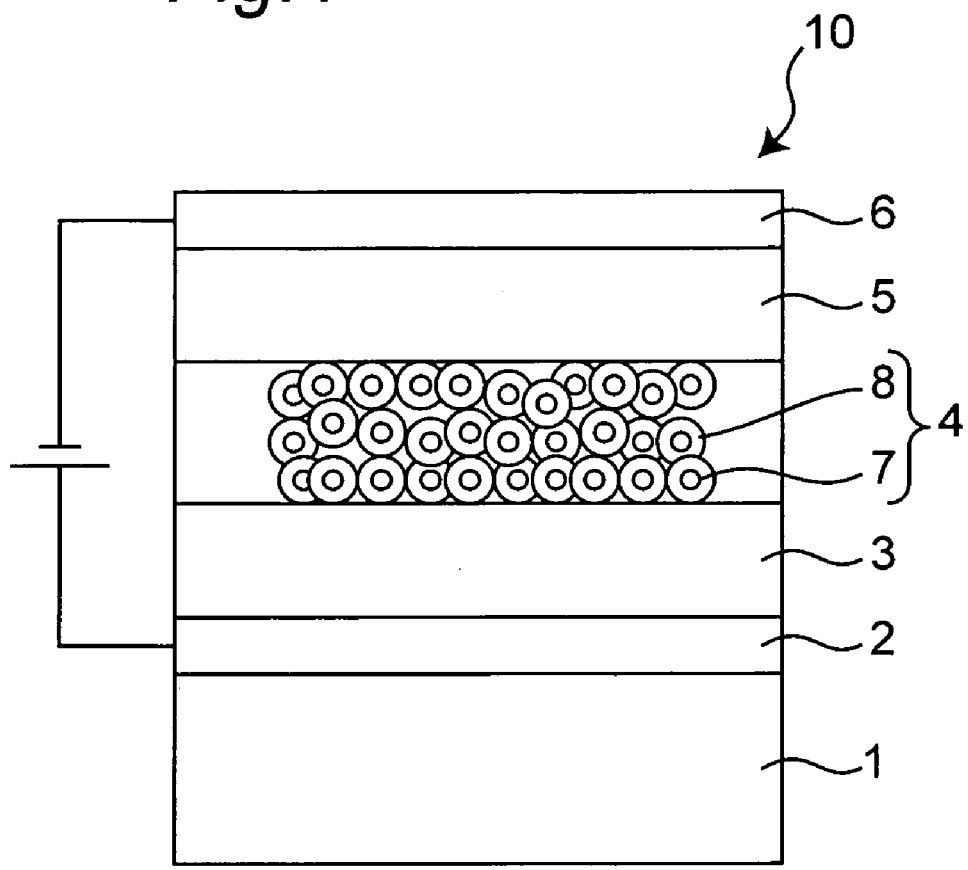
FIG. 1 is a cross-sectional view showing the configuration of a phosphor element according to a first embodiment of the present invention.

Phosphor elements according to embodiments of the present invention will be explained in detail below with reference to accompanying drawings. However, the present invention is not limited to these embodiments. Note that substantially same members in the drawings are denoted by the same reference numerals.

First Embodiment

Figure 2:
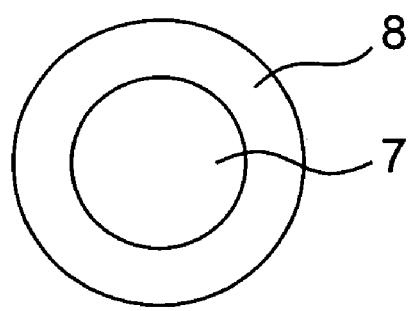
FIG. 2 is a cross-sectional view showing a semi-conductive phosphor fine particle in which substantially all surface thereof is covered, in the first embodiment of the present invention.

A phosphor element according to a first embodiment of the present invention will be explained by using FIGS. 1 and 2. FIG. 1 is a schematic diagram showing the element structure of the phosphor element 10. The phosphor element 10 is so configured that a phosphor layer 4 is interposed between first and second electron transport layers 3, 5, and further the electron transport layers 3, 5 are interposed between a first and second electrodes 2, 6. Explaining from the viewpoint of the lamination relationship between the respective layers, the phosphor element 10 is so configured that on a transparent substrate 1 as a substrate, the first electrode 2, the first electron transport layer 3, the phosphor layer 4, the second electron transport layer 5 and the second electrode 6 are laminated in sequence. Further, emitted light is extracted from the side of the transparent substrate 1 supporting the first electrode 2. Further, FIG. 2 is a cross-sectional view showing a semi-conductive phosphor fine particle included in the phosphor layer 4 of the phosphor element 10. The semi-conductive phosphor fine particle 7 is so configured that a part or substantially all of the surface thereof is covered with a conductive organic material 8.

Next, the luminescence property of the phosphor element 10 will be explained. Electrodes are drawn from an Ag electrode (second electrode) 6 and from an ITO transparent electrode (first electrode) 2 of the phosphor element, and an outside voltage is applied between the Ag electrode 6 and the ITO transparent electrode, whereby a peak luminance is obtained. In the first embodiment, zinc oxide having a particle diameter of 0.2 µm to 0.5 µm was used as a semi-conductive phosphor fine particle. The surface of the semi-conductive phosphor fine particle is covered with polymethyl methacrylate.

Next, a method of manufacturing the phosphor element 10 will be explained. The phosphor element was produced in the following procedures.

(a) As the substrate 1, a non-alkali glass substrate was used. The thickness of the substrate 1 was 1.7 mm.

(b) On the substrate 1, an ITO oxide target was used as the first electrode 2, and the ITO transparent electrode 2 was formed by the RF magnetron sputtering.

(c) Next, on the ITO transparent electrode 2, 1,3,5-tris [5-(4-tert-butylphenyl)-1,3,4-oxadiazol-2-yl]benzene was formed as the first electron transport layer 3 by the vacuum vapor deposition.

(d) On the electron transport layer 3 formed, the phosphor layer 4 was formed by coating in which a semi-conductive phosphor fine particle having the particle diameter of 1 µm or smaller was covered with a conductive material or the conductive material was chemically absorbed.

(e) Further, on the phosphor layer 4, the second electron transport layer 5 consisting of 1,3,5-tris[5-(4-tert-butylphenyl)-1,3,4-oxadiazol-2-yl]benzene was formed by the vacuum vapor deposition.

(f) On the electron transport layer 5, Ag electrode paste was screen-printed as the second electrode, and was dried to thereby form the second electrode 6.

Through the steps described above, the phosphor element 10 was completed.

When the first electrode 2 and the second electrode 6 of the first embodiment are connected with the positive electrode and the negative electrode of the DC source respectively and an DC voltage was applied, bright luminescence was confirmed at 15V. Since the phosphor element of first embodiment is driven with a low voltage, it is possible to control pixels by using TFTs.

Second Embodiment

A phosphor element according to second embodiment of the present invention will be explained. This phosphor element is same as the phosphor element of the first embodiment except that the semi-conductive phosphor fine particle 7 is indium oxide in which europium is doped. When the first electrode 2 and the second electrode 6 of the second embodiment were connected with the positive electrode and the negative electrode of the DC source respectively and a DC voltage was applied, bright luminescence was confirmed at 18V. Since the phosphor element of second embodiment is driven with a low voltage, it is possible to control pixels by using TFTs.

Third Embodiment

A phosphor element according to third embodiment of the present invention will be explained. This phosphor element is same as the phosphor element of the first embodiment except that the semi-conductive phosphor fine particle 7 is a tin oxide in which europium is doped. When the first electrode 2 and the second electrode 6 of the third embodiment were connected with the positive electrode and the negative electrode of the DC source respectively and a DC voltage was applied, bright luminescence was confirmed at 22V. Since the phosphor element of the third embodiment is driven with a low voltage, it is possible to control pixels by using TFTs.

Fourth Embodiment

A phosphor element according to a fourth embodiment of the present invention will be explained. This phosphor element is same as the phosphor element of the first embodiment except that the semi-conductive phosphor fine particle 7 is $ZnGa_2O_4$. When the first electrode 2 and the second electrode 6 of the fourth embodiment were connected with the positive electrode and the negative electrode of the DC source respectively and a DC voltage was applied, bright luminescence was confirmed at 28V Since the phosphor element of the fourth embodiment is driven with a low voltage, it is possible to control pixels by using TFTs.

Fifth Embodiment

A phosphor element according to a fifth embodiment of the present invention will be explained. This phosphor element is same as the phosphor element of the first embodiment except that the second electron transport layer 5 is not included. When the first electrode 2 and the second electrode 6 of the fifth embodiment were connected with the positive electrode and the negative electrode of the DC source respectively and a DC voltage was applied, bright luminescence was confirmed at 48V Since the phosphor element of the fifth embodiment is driven with a low voltage, it is possible to control pixels by using TFTs.

Sixth Embodiment

A phosphor element according to a sixth embodiment of the present invention will be explained. This phosphor element is same as the phosphor element of the first embodiment except that the first electron transport layer 3 is not included. When the first electrode 2 and the second electrode 6 of the sixth embodiment were connected with the positive electrode and the negative electrode of the DC source respectively and a DC voltage was applied, bright luminescence was confirmed at 58V. Since this phosphor element is driven with a low voltage, it is possible to control pixels by using TFTs.

In the phosphor elements according to the first embodiment to sixth embodiment, colors of the luminescence extracted from the phosphor elements are determined depending on semi-conductive phosphor fine particles. Two or more kinds of semi-conductive phosphor fine particles may be mixed in the phosphor layer. For example, by mixing semi-conductive phosphor fine particles of two colors in the complementary color relation or three RGB colors, white color emission can be extracted. Further, for multiple color display, white color display or adjustment of color purity of each color, a color conversion layer may be further provided in front of a light extracting direction of the phosphor layer 4, or a light conversion material may be mixed in the transparent conductive matrix or in the electron transport layer 3. The color conversion material may be one which emits light by using light as an excitation source, so known phosphor, pigment or die may be used whether organic or inorganic. Thereby, blue light generated from the phosphor layer is absorbed by a color conversion material, and green and red lights may be caused, whereby these lights are mixed and extracted from the phosphor element, and a white color emission is obtained.

Seventh Embodiment

Figure 3:
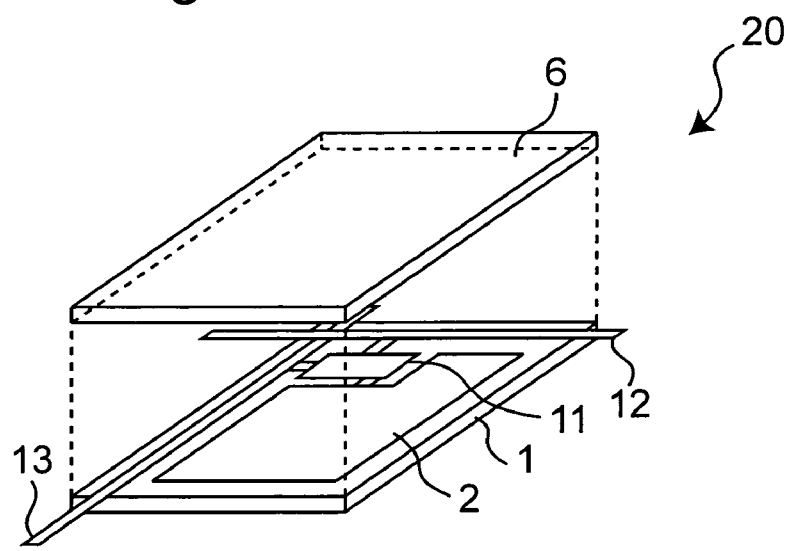
FIG. 3 is a perspective view showing the electrode configuration of a phosphor element according to a seventh embodiment of the present invention.

A phosphor element 20 according to a seventh embodiment of the present invention will be explained by using FIG. 3. FIG. 3 is a perspective view showing the electrode configuration of the phosphor element 20. The phosphor element 20 further includes a thin film transistor 11 connected with the electrode 2 of the phosphor element 10 shown in FIG. 1. The thin film transistor 11 is connected with an x electrode 12 and a y electrode 13. In the phosphor element 20, at least a part of the surface of the semi-conductive phosphor fine particle 7 is covered with an organic conductive material 8. Therefore, it is possible to be driven at a low voltage, so a thin film transistor 11 can be used. Further, by using the thin film transistor 11, it is possible to cause the phosphor element 20 to have a memory function. As the thin film transistor 11, low temperature polysilicon or amorphous thin film transistor may be used. Further, it may be an organic thin film transistor composed of a thin film including an organic material.

Eighth Embodiment

Figure 4:
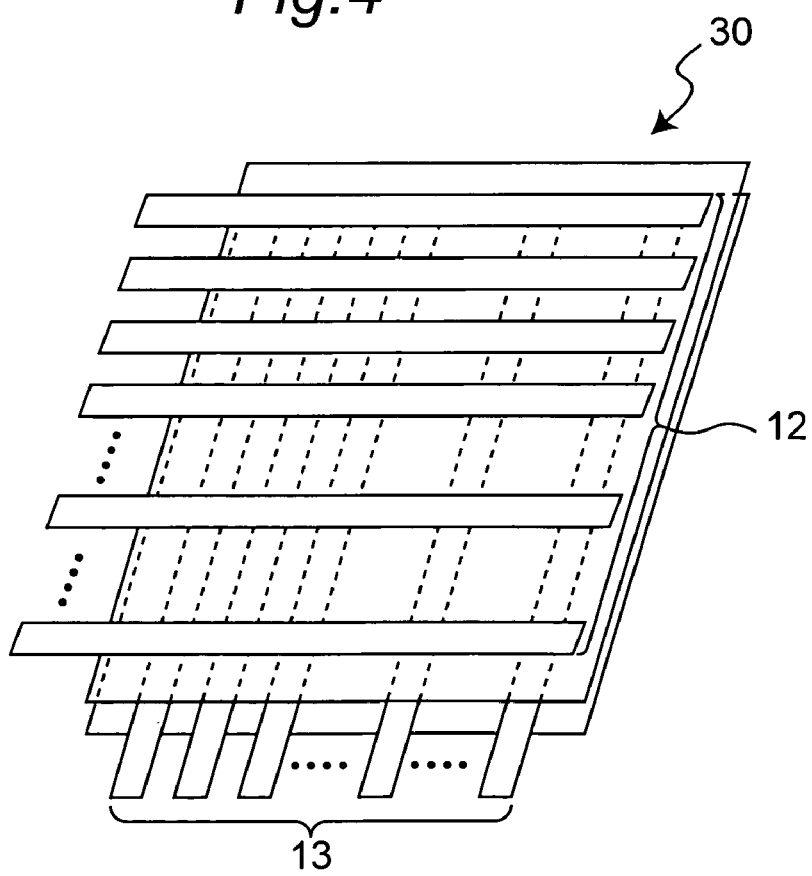
FIG. 4 is a schematic plan view showing a display device according to an eighth embodiment 8 of the present invention.

A display device according to an eighth embodiment of the present invention will be explained by using FIG. 4. FIG. 4 is a schematic plan view showing an active matrix type display device composed of the x electrodes 12 and the y electrodes 13, orthogonal to each other, of the display device 30. The display device 30 is an active matrix type display device having thin film transistors 11. The active matrix type display device 30 includes: a luminescent array in which a plurality of phosphor elements 20 having thin film transistors 11 shown in FIG. 3 are arranged in two dimensions; a plurality of x electrodes 12, in parallel with each other, extending in a first direction in parallel with a face of the luminescent array; and a plurality of y electrodes 13 extending in parallel with a second direction, orthogonal to the first direction, in parallel with the face of the luminescent array. The thin film transistor 11 of the luminescent array is connected with the x electrode 12 and the y electrode 13, respectively. A phosphor element defined by a pair of x electrode 12 and y electrode 13 forms one pixel. According to the active matrix device 30, the phosphor layer 4 configuring the phosphor element of each pixel includes semi-conductive phosphor fine particles 7 in each of which the surface is covered with the organic conductive material, as described above. Thereby, a low voltage drive is possible, so it is possible to use thin film transistors 11 and to utilize memory effect. Further, since it is driven with a low voltage, a display device of long lifetime can be obtained.

By forming the phosphor layer of three RGB colors including phosphors of three RGB colors respectively for each pixel, a color display device can be obtained. Further, a color filter may be provided for adjusting the color purity. Further, as another color display device, a configuration in which a color conversion filter is further included in a display device of monochromatic light emission is also possible. For example, by filtering blue color light from the phosphor element through a color conversion filter, a color display is obtained by converting it into green color or red color.

Comparative Example 1

A phosphor element of a comparative example 1 will be explained. This phosphor element is same as the phosphor element of the first embodiment except that the semi-conductive phosphor fine particle is not covered with a conductive organic material or not performed with chemical adsorption. When the first electrode 2 and the second electrode 6 were connected with the positive electrode and the negative electrode respectively and a DC voltage was applied, bright luminescence was confirmed at 120 V. However, since the phosphor element of comparative example 1 is driven with a high voltage, it is difficult or impossible to control pixels by using TFTs.

Comparative Example 2

A phosphor element of a comparative example 2 will be explained. This phosphor element is same as the phosphor element of the first embodiment except that the particle diameter exceeded 1 µm, and zinc oxide having the particle diameter of 1 µm to 1.4 µm was used. When the first electrode 2 and the second electrode 6 were connected with the positive electrode and the negative electrode respectively and a DC voltage was applied, bright luminescence was confirmed at 100V. However, since the phosphor element of comparative example 2 is driven with a high voltage, it is difficult or impossible to control pixels by using TFTs.

Although the present invention has been described in detail by way of preferred embodiments as described above, the present invention is not limited to these embodiments. It is obvious for those skilled in the art that various preferable deformations and modifications are possible within the technical range of the present invention described in the scope of claims below.

The invention claimed is:

1. A phosphor element comprising:
 a pair of electrodes facing each other; and
 a phosphor layer interposed between the pair of electrodes and including a semi-conductive phosphor fine particle in which at least a part of a surface is covered with a conductive organic material, wherein the conductive organic material is chemically adsorbed on the surface of the semi-conductive phosphor fine particle by a dehydration reaction between a hydroxide group of the surface of the semi-conductive phosphor fine particle and the conductive organic material.

2. The phosphor element according to claim 1, wherein the semi-conductive phosphor fine particle has a particle diameter of 1 µm or less.

3. The phosphor element according to claim 1, wherein the semi-conductive phosphor fine particle includes oxide or composite oxide including at least one element selected from the group consisting of Zn, Ga, In, Sn and Ti.

4. The phosphor element according to claim 1, wherein the phosphor layer is so configured that the semi-conductive phosphor fine particles are dispersed in a transparent conductive matrix.

5. The phosphor element according to claim 1, further comprising an electron transport layer between the phosphor layer and at least one of the electrodes.

6. The phosphor element according to claim 1, further comprising a thin film transistor connected with at least one of the pair of electrodes.

7. A display device comprising:
 a luminescent array in which phosphor elements are arranged in a plane, wherein the phosphor element comprises:
 a pair of electrodes facing each other;
 a phosphor layer interposed between the pair of electrodes and including a semi-conductive phosphor fine particle in which at least a part of a surface is covered with a conductive organic material, wherein the conductive organic material is chemically adsorbed on the surface of the semi-conductive phosphor fine particle by a dehydration reaction between a hydroxide group of the surface of the semi-conductive phosphor fine particle and the conductive organic material;
 a thin film transistor connected with at least one of the pair of electrodes;
 a plurality of x electrodes, in parallel with each other, extending in a first direction in parallel with a face of the luminescent array; and
 a plurality of y electrodes extending in parallel with a second direction, orthogonal to the first direction, in parallel with the face of the luminescent array, wherein a thin film transistor of the luminescent array is connected with the x electrode and the y electrode, respectively.

* * * * *